(12) United States Patent
Kruit et al.

(10) Patent No.: US 10,453,649 B2
(45) Date of Patent: Oct. 22, 2019

(54) APPARATUS AND METHOD FOR INSPECTING A SAMPLE USING A PLURALITY OF CHARGED PARTICLE BEAMS

(71) Applicant: Technische Universiteit Delft, Delft (NL)

(72) Inventors: Pieter Kruit, Delft (NL); Aernout Christiaan Zonnevylle, Delft (NL); Yan Ren, Delft (NL)

(73) Assignee: TECHNISCHE UNIVERSITEIT DELFT (NL)

( * ) Notice: Subject to any disclaimer, the term of this patent is extended or adjusted under 35 U.S.C. 154(b) by 0 days.

(21) Appl. No.: 15/309,748

(22) PCT Filed: Apr. 23, 2015

(86) PCT No.: PCT/NL2015/050271
§ 371 (c)(1),
(2) Date: Nov. 8, 2016

(87) PCT Pub. No.: WO2015/170969
PCT Pub. Date: Nov. 12, 2015

(65) Prior Publication Data
US 2017/0133198 A1 May 11, 2017

(30) Foreign Application Priority Data
May 8, 2014 (NL) ................................. 2012780

(51) Int. Cl.
*H01J 37/20* (2006.01)
*H01J 37/244* (2006.01)
(Continued)

(52) U.S. Cl.
CPC .......... *H01J 37/244* (2013.01); *H01J 37/141* (2013.01); *H01J 37/20* (2013.01); *H01J 37/222* (2013.01);
(Continued)

(58) Field of Classification Search
CPC .......................... H01J 2237/2808; H01J 37/28
See application file for complete search history.

(56) References Cited

U.S. PATENT DOCUMENTS

| 2004/0159787 A1 | 8/2004 | Nakasuji et al. ............. 250/311 |
| 2006/0016989 A1 | 1/2006 | Nakasuji et al. ............. 250/310 |

(Continued)

FOREIGN PATENT DOCUMENTS

| CN | 101131909 | 2/2008 | ............. H01J 37/28 |
| CN | 101137889 | 3/2008 | ............. G01B 15/02 |

(Continued)

OTHER PUBLICATIONS

Coenen et al., "Angle-resolved cathodoluminescence spectroscopy," Applied Physics Letters, American Institute of Physics, vol. 99, No. 14, Oct. 3, 2011 (12 pgs).

(Continued)

*Primary Examiner* — Eliza W Osenbaugh-Stewart
(74) *Attorney, Agent, or Firm* — Hayes Soloway P.C.

(57) ABSTRACT

An apparatus for inspecting a sample includes a sample holder for holding the sample; a multi beam charged particle generator for generating an array of primary charged particle beams; an electro-magnetic lens system for directing the array of primary charged particle beams into an array of separate focused primary charged particle beams on the sample; a multi-pixel photon detector arranged for detecting photons created by the focused primary charged particle beams when the primary charged particle beams impinge on the sample or after transmission of said primary charged (Continued)

particle beams through the sample; and an optical assembly for conveying photons created by at least two adjacent focused primary charged particle beams of the array of separate focused primary charged particle beams to distinct and/or separate pixels or to distinct and/or separate groups of pixels of the multi-pixel photon detector.

15 Claims, 6 Drawing Sheets

(51) Int. Cl.
  *H01J 37/22* (2006.01)
  *H01J 37/28* (2006.01)
  *H01J 37/141* (2006.01)
(52) U.S. Cl.
  CPC ............ *H01J 37/224* (2013.01); *H01J 37/28* (2013.01); *H01J 2237/2443* (2013.01); *H01J 2237/24455* (2013.01); *H01J 2237/24495* (2013.01); *H01J 2237/2802* (2013.01); *H01J 2237/2808* (2013.01)

(56) References Cited

U.S. PATENT DOCUMENTS

| | | | |
|---|---|---|---|
| 2007/0228274 A1 | 10/2007 | Elyasaf et al. | 250/306 |
| 2008/0042059 A1 | 2/2008 | Tashiro et al. | 250/307 |
| 2008/0067384 A1 | 3/2008 | Ikku et al. | 250/310 |
| 2010/0320382 A1 | 12/2010 | Almogy et al. | 250/307 |
| 2011/0220793 A1* | 9/2011 | Thomas | H01J 37/20 250/307 |
| 2015/0155134 A1* | 6/2015 | Frosien | H01J 37/05 250/310 |
| 2015/0228447 A1 | 8/2015 | Ominami et al. | H01J 37/16 |

FOREIGN PATENT DOCUMENTS

| | | | |
|---|---|---|---|
| JP | H1054878 | 2/1998 | ............ G01T 1/20 |
| JP | 2003257355 | 9/2003 | ............ H01J 37/05 |
| JP | 2004095281 | 3/2004 | ............ G03F 1/84 |
| JP | 2006066181 | 3/2006 | ........... H01J 37/244 |
| WO | WO 2007028596 | 3/2007 | ............ H01J 37/04 |
| WO | WO2013191539 | 12/2013 | ........... H01J 37/244 |
| WO | WO 2014030430 | 2/2014 | ............ H01J 37/16 |
| WO | WO2014065663 | 5/2014 | .......... G01N 23/203 |

OTHER PUBLICATIONS

International Preliminary Report on Patentability issued in application No. PCT/NL2015/050271, dated Nov. 8, 2016 (6 pgs).
International Search Report and Written Opinion issued in application No. PCT/NL2015/050271, dated Jul. 24, 2015 (9 pgs).
Mohammadi-Gheidari et al., Electron optics of multi-beam scanning electron microscope, Nuclear Instruments and Methods in Physics Research Section A: Accelerators, Spectrometers, Detectors and Associated Equipment vol. 645, No. 1, Jul. 21, 2011, pp. 60-67 (8 pgs).
Chinese Office Action (w/translation) issued in application No. 201580036950.2, dated Sep. 29, 2017 (13 pgs).
Japanese Office Action (w/translation) issued in application No. 2016-566736, dated Feb. 21, 2019 (23 pgs).

* cited by examiner

APPARATUS AND METHOD FOR INSPECTING A SAMPLE USING A PLURALITY OF CHARGED PARTICLE BEAMS

BACKGROUND

The invention relates to an apparatus and a method for inspecting a thin sample. In particular the invention relates to an apparatus for inspecting a sample using a plurality of charged particle beams, such as a multi-beam scanning electron microscope. The invention may be applied to charged particles of any type, such as electrons, positrons, ions and others.

Such an apparatus is for example disclosed in A. Mohammadi-Gheidari and P. Kruit "Electron optics of multi-beam scanning electron microscope" Nuclear Instruments and Methods in Physics Research A 645 (2011) 60-67. This publication discloses an electron microscope comprising a electron source for generating an array of primary charged particle beams, in particular an array of primary electron beams. These primary electron beams pass an objective lens which directs the electron beams from a common cross-over towards the sample and focuses the primary electron beams into an array of individual spots on the sample. In order to form an image of the sample, it is necessary to detect a characteristic signal from each beam. In an electron microscope this can be either the secondary electron signal, or the backscatter electron signal, or the transmitted electron signal. Methods to detect the secondary electron signal and the backscatter electron signal have been disclosed in respectively PCT/NL2013/050416 and PCT/NL2013/050746.

A disadvantage of those methods is that either the detector itself, or a beam separation device needs to be placed in the path of the primary electron beams. Another disadvantage of those methods is that the excitation of the lenses for the primary beams needs to be adjusted in order to accommodate the signal electron beams. Finally, some contrast mechanisms in the sample to be inspected are better suited for transmission detection than secondary or backscattered detection.

It is an object of the present invention to provide a multi charged particle beam apparatus for inspecting a sample which provides a new detection arrangement for detecting a signal created by the multiple charged particle beams.

SUMMARY OF THE INVENTION

According to a first aspect, the invention pertains to an apparatus for inspecting a sample, wherein the apparatus comprises:

a sample holder for holding the sample, a multi beam charged particle generator for generating an array of primary charged particle beams, an electro-magnetic lens system for directing said array of primary charged particle beams into an array of separate focused primary charged particle beams at the sample holder, a multi-pixel photon detector arranged for detecting photons created by said focused primary charged particle beams when said primary charged particle beams impinge on the sample or after transmission of said primary charged particle beams through the sample, and an optical assembly for conveying photons created by at least two adjacent focused primary charged particle beams of said array of separate focused primary charged particle beams to distinct and/or separate pixels or to distinct and/or separate groups of pixels of the multi-pixel photon detector.

The apparatus of the present invention is arranged to detect photons created by said focused primary charged particle beams when said primary charged particle beams impinge on the sample or after transmission of said primary charged particle beams through the sample, in stead of or in addition to detecting a secondary electron signal and/or a backscatter electron signal. In addition the apparatus of the present invention is provided with a multi/pixel detector to detect the created photons from two or more focused primary charged particle beams. According to the invention, the optical assembly and/or the multi-pixel photon detector are arranged to provide a resolution which enables to distinguish a light signal created by one of said at least two adjacent focused primary charged particle beams from a light signal created by the other one of said at least two adjacent focused primary charged particle beams. The apparatus of the invention thus provides a new detection arrangement for individually detecting the created photons of two or more focused primary charged particle beams simultaneous.

It is noted that the optical assembly can be either arranged at a side of the sample holder which faces towards the electro-magnetic lens system, or at an opposite side of the sample holder which faces away from the electro/magnetic lens system.

A phenomenon which causes the emission of photons due to the impact of charged particles on a material, in particular a luminescent material, is referred to as cathodoluminescence. It is noted that in case the sample comprises one or more cathodoluminescent constituents, photons are created by said focused primary charged particle beams when said primary charged particle beams impinge on the sample, in particular the cathodoluminescent constituents thereof.

In an embodiment, said apparatus comprises a layer of cathodoluminescent material, wherein the sample holder is arranged to position the sample between the electro-magnetic lens system and the layer of cathodoluminescent material, such that the charged particles impinge on the layer of cathodoluminescent material after transmission through said sample. In this embodiment, the sample does not need to have cathodoluminescent constituents, because the photons are created by said focused primary charged particle beams when said primary charged particle beams impinge on the layer of cathodoluminescent material after transmission of said primary charged particle beams through the sample.

In an embodiment, the layer of cathodoluminescent material is supported by a light transmitting support plate. On the one hand, the use of a support plate allows the use of a thin layer of cathodoluminescent material. On the other hand, the use of a light transmitting support plate allows the created photons to travel through the support plate and allows to arrange the optical assembly and the multi-pixel photon detector at a side of the support plate facing away from the thin layer of cathodoluminescent material.

In an embodiment, said layer of cathodoluminescent material is covered with a charge conducting layer, preferably wherein the charge conducting layer is arranged at a side of said layer of cathodoluminescent material facing the electro-magnetic lens system. The charge conducting layer enables to spread and-or remove surface charge induced by the impinging charged particles. Preferably, in use, the charge conducting layer is conducingly connected to ground potential to lead away the surface charge.

In an embodiment, said sample holder is arranged to position the sample in direct contact with and/or supported by said layer of cathodoluminescent material.

In an alternative embodiment, said sample holder is arranged to position the sample at a distance from said layer of cathodoluminescent material. By positioning the sample at a distance from the layer of cathodoluminescent material, the light signals created by the charged particle beams that were not scattered in the sample can be distinguished from the light signals created by the charged particles that were scattered in the sample, in particular for each charged particle beam.

In Addition, by arranging the sample at a distance from the cathodoluminescent material, bright field images or dark field images can be created. The necessary distance depends on the electron energy and the contrast required. It is also possible to distinguish between electrons scattered in different directions.

In an embodiment, said optical arrangement comprises a lens system which is arranged for imaging said created photons onto the multi-pixel photon detector with an optical magnification between 5 and 500.

In an embodiment, the electro-magnetic lens system is arranged to project an array of separate spots on the sample surface where the focused primary charged particle beams impinge on the sample on the sample holder, wherein the pitch between the spots on the sample surface is between 0.3 and 30 micrometers. The beams preferably are sufficiently separated that the scattering range of the electrons in the sample or the cathodoluminescent material is smaller than the distance between the electron beams. For 5 kV electrons this scattering range is typically 300-500 nm. For higher energy electrons this is more. In this situation it is also possible to use a thin layer of cathodoluminescent material, such that the lateral scattering range in the thin layer is smaller than the distance between the focused primary charged particle beams.

In an embodiment, the multi-pixel photon detector is a COD camera, a CMOS camera, an array of avalanche photo diodes or an array of photo multipliers.

In an embodiment, the CCD camera, CMOS camera, array of avalanche photo diodes or photo multipliers comprises an array of detector pixels is positioned such that the array of detector pixels coincides with an array of images of the individual light spots created by the individual beams of said primary charged particle beams. In particular the optical assembly projects or images the individual light spots created by the individual beams of said primary charged particle beams into the array of images.

In an embodiment, said apparatus further comprising a system for scanning the focused primary charge particle beams over said sample holder. In use, when a sample is arranged on or in said sample holder, the scanning system is arranged for scanning the focused primary charge particle beams over said sample. In an embodiment, said apparatus further comprises a control-and-signal-processing system for controlling the scanning system and/or the detector, and/or for creating one image per primary charged particle beam.

In an embodiment, said apparatus comprising a first actuating system for moving the sample holder at a constant speed in a first direction, and a second actuating system for scanning the focused primary charge particle beams over said sample holder in a second direction at least substantially perpendicular to the first direction. In an embodiment, said apparatus further comprises a control-and-signal-processing system for controlling the first and second actuating system and/or the detector, and/or for creating one image per primary charged particle beam.

In an embodiment, said apparatus further comprises a signal processing unit for combining said individual images per primary charged particle beam into one combined image of at least a part of the sample.

In an embodiment, said primary charged particle beams comprises electron beams.

According to a second aspect, the invention pertains to a method for inspecting a sample, using an apparatus comprises:

a sample holder which holds the sample, a multi beam charged particle generator which generates an array of primary charged particle beams, an electro-magnetic lens system which directs said array of primary charged particle beams into an array of separate focused primary charged particle beams on said sample in or on the sample holder, a multi-pixel photon detector arranged to detect photons created by said focused primary charged particle beams when said primary charged particle beams impinge on the sample or after transmission of said primary charged particle beams through the sample, and an optical assembly which conveys the photons created by at least two adjacent focused primary charged particle beams of said array of separate focused primary charged particle beams to distinct and/or separate pixels or to distinct and/or separate groups of pixels of the multi-pixel photon detector.

In an embodiment of said method, said apparatus comprises a layer of cathodoluminescent material, wherein the sample holder is arranged to position the sample between the electro-magnetic lens system and the layer of cathodoluminescent material, wherein the charged particles which pass through said sample, subsequently impinge on the layer of cathodoluminescent material.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
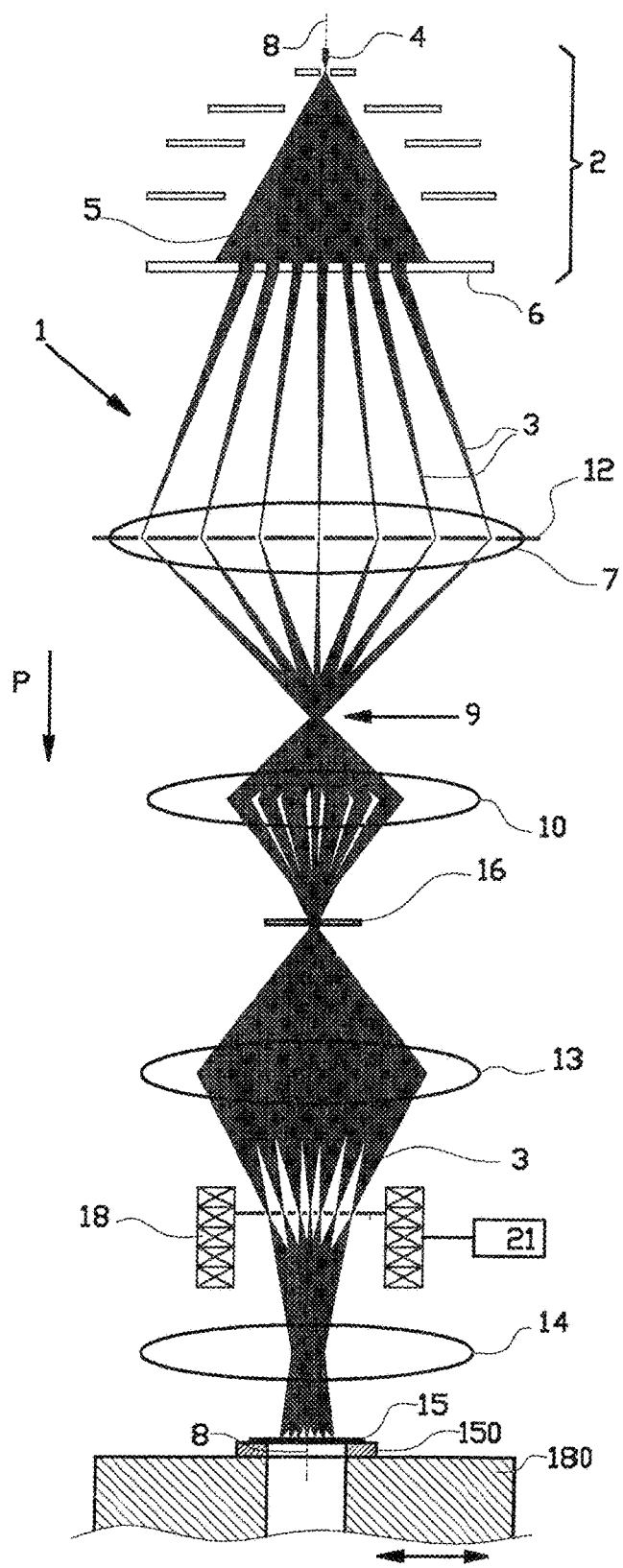
FIG. 1 shows an example of a Multi-Beam Scanning Electron Microscope (MBSEM)

FIG. 1 shows an example of a Multi-Beam Scanning Electron Microscope (MBSEM) of the invention. The MBSEM 1 comprises a multi beam charged particle generator 2 for generating an array of primary charged particle beams, in this case an array of primary electron beams 3. The multi beam electron generator 2 comprises at least one electron source 4 for generating a diverging electron beam 5. The diverging electron beam 5 is split into an array of focused primary electron beams 3 by an aperture lens array 6. The primary electron beams 3 are subsequently directed towards a sample 15 in a sample holder 150, as schematically indicated by the arrow P.

The multiple images of the source 4 are positioned on the object principle plane of an accelerator lens 7. The accelerator lens 7 directs the primary electron beams 3 towards the optical axis 8 and creates a first common cross-over 9 of all the primary electron beams 3.

The first common cross-over 9 is imaged by the magnetic condenser lens 10 onto a variable aperture 16 that acts as a current limiting aperture. At the variable aperture 16, a second common cross-over of all the primary electron beams 3 is created.

The MBSEM comprises a lens system 13, 14 for directing the primary charged particle beams from the common cross-over at the variable aperture 16 towards the sample surface 15 and for focusing all primary charged particle beams 3 into an array of individual spots on the sample surface 15. The lens system comprises an intermediate magnetic lens 13 for imaging the variable aperture 16 onto a coma free plane of the objective lens 14, which objective lens 14 creates an array of focused primary electron beams on the sample surface 15.

In addition the MBSEM is provided with scan coils 18 for scanning the array of focused primary electron beams over the sample surface 15.

The MBSEM thus comprises a multi beam charged particle generator 2 for generating an array of primary charged particle beams 3, and an electro-magnetic lens system 13, 14 for directing said array of primary charged particle beams 3 into an array of separate focused primary charged particle beams at said sample 15 in the sample holder 150.

Figure 2:
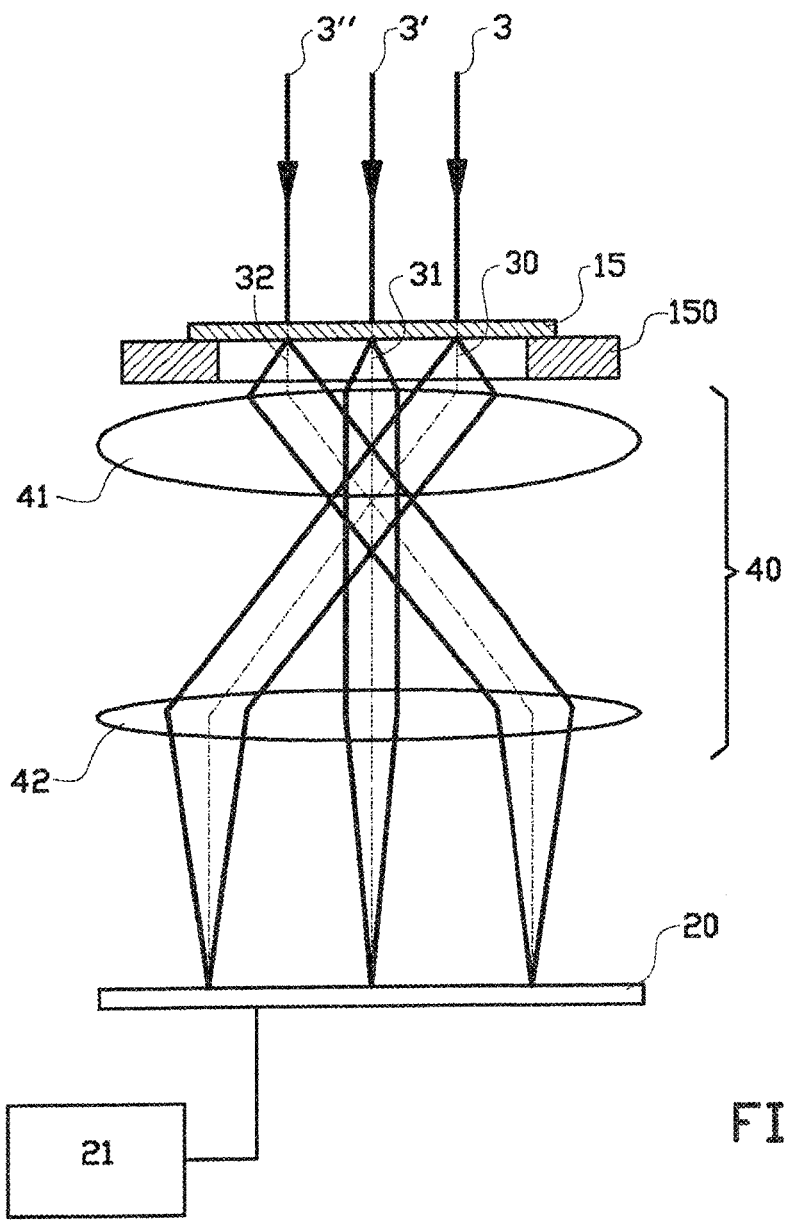
FIG. 2 shows a first embodiment of a detection arrangement according to the invention.

According to the invention, and as schematically shown in a first example of FIG. 2, the apparatus further comprises a multi-pixel photon detector 20 arranged for detecting photons 30, 31, 32 created by said focused primary charged particle beams 3, 3', 3" when said primary charged particle beams 3, 3', 3" impinge on the sample 15. In addition the apparatus comprises an optical assembly 40 for conveying photons 30, 31 created by at least two adjacent focused primary charged particle beams 3, 3' of said array of separate focused primary charged particle beams 3, 3', 3" to distinct and/or separate pixels or to distinct and/or separate groups of pixels of the multi-pixel photon detector 20.

When the sample 15 comprises one or more cathodoluminescent constituents, photons 30, 31, 32 are created by said focused primary charged particle beams 3, 3', 3" when said primary charged particle beams 3, 3', 3" impinge on the sample 15, in particular on the cathodoluminescent constituents thereof.

Figure 3:
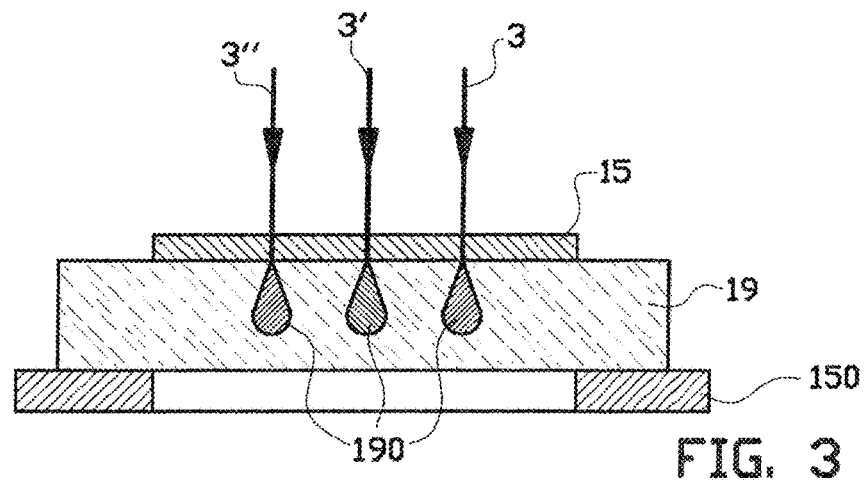
FIG. 3 shows the arrangement of the sample on top of a cathodoluminescent layer.

However, when the sample 15 does not generate sufficient photons 30, 31, 32 to be readily detected by the multi-pixel photon detector 20, a layer of cathodoluminescent material 19 is arranged at a side of the sample 15 facing away from the electro-magnetic lens system 13, 14, such that the charged particles from the primary charged particle beams 3, 3', 3" impinge on the layer of cathodoluminescent material 19 after transmission through said sample 15. In the example as shown in FIG. 3, the sample holder 150 is arranged to position the sample 15 in direct contact with and supported by said layer of cathodoluminescent material 19. When the charged particles from the primary charged particle beams 3, 3', 3" hit the layer of cathodoluminescent material 19, photons are created from an interaction volume 190. The size of this interaction volume 190 and the intensity of the generated light, depends, inter alia, on the energy of the charged particles which impinge of the layer of cathodoluminescent material 19.

Figure 4:
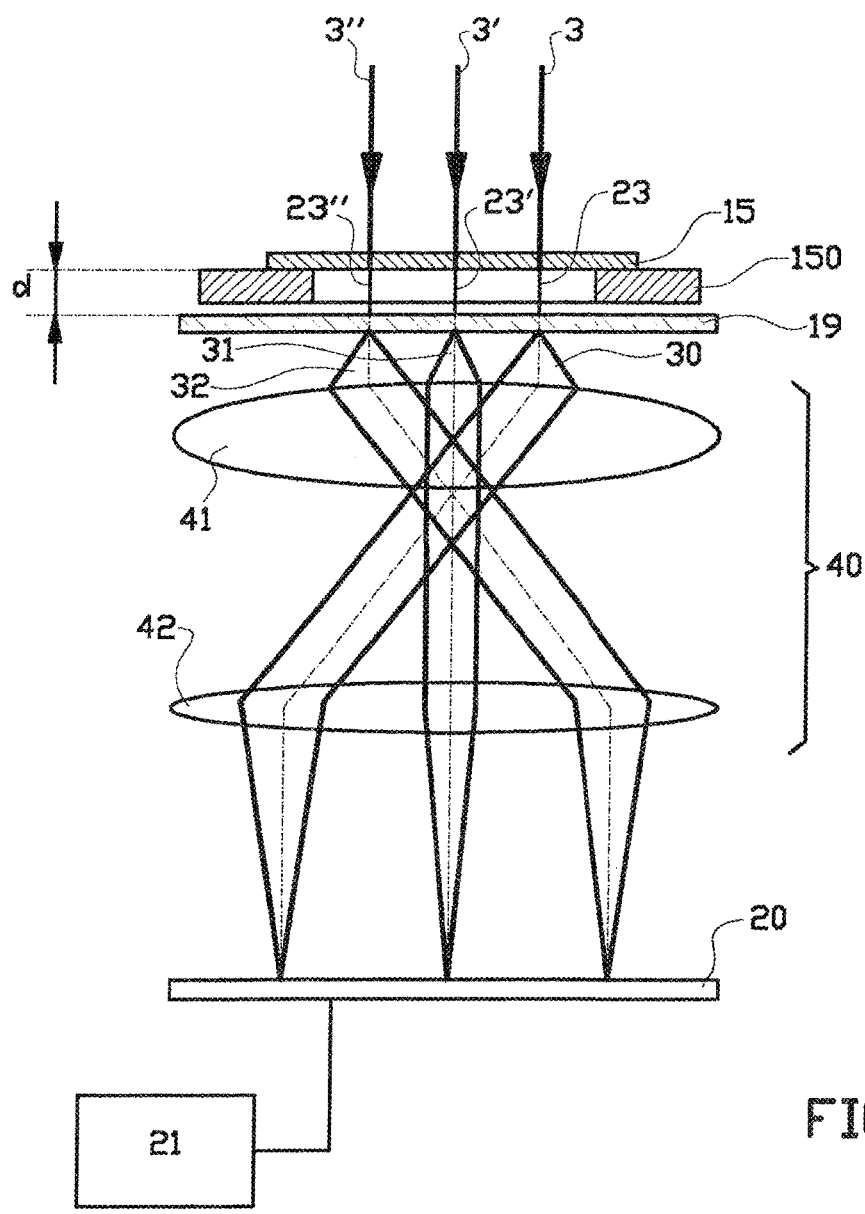
FIG. 4 shows a second embodiment of a detection arrangement according to the invention.

In a second example of the apparatus of the present invention, as schematically shown in FIG. 4, the sample holder 150 is arranged to position the sample 15 at a distance d from said layer of cathodoluminescent material 19. Again, the apparatus comprises a multi-pixel photon detector 20 arranged for detecting photons 30, 31, 32 created by charged particle beams 23, 23', 23" when they impinge on the layer of cathodoluminescent material 19 after transmission of the primary focused charged particle beams 3, 3', 3" through sample 15. The apparatus also comprises an optical assembly 40 for conveying photons 30, 31 created by at least two adjacent charged particle beams 23, 23' of said array of transmitted charged particle beams 23, 23', 23" to distinct and/or separate pixels or to distinct and/or separate groups of pixels of the multi-pixel photon detector 20.

Figure 5:
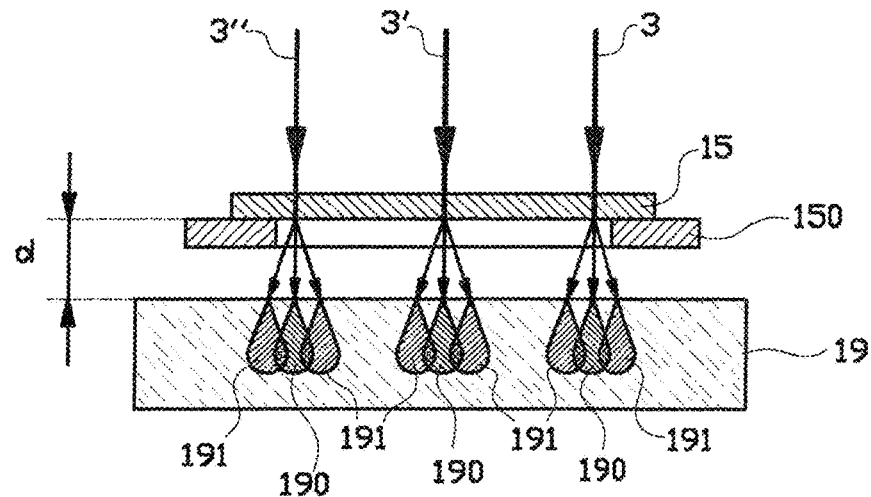
FIG. 5 shows the arrangement of the sample at a distance from a cathodoluminescent layer.

The arrangement of the sample 15 and the layer of cathodoluminescent material 19 is shown in more detail in FIG. 5. This figure shows furthermore that the charged particles of the primary focused charged particle beams 3, 3', 3" can travel straight through the sample 15. These charged particles are also denoted as $0^{th}$ order transmitted charged particles. When the $0^{th}$ order transmitted charged particles hit the layer of cathodoluminescent material 19, photons are created from an interaction volume 190. When using the photons created by these $0^{th}$ order transmitted charged particles to make an image of the sample, a bright field image is obtained.

In addition, the charged particles of the primary focused charged particle beams 3, 3', 3" can also be scattered by the sample 15. These scattered charged particles exit the sample 15 at an angle with respect to the straight traveling $0^{th}$ order transmitted charged particles. Because of the distance d between the sample 15 and the layer of cathodoluminescent material 19, the scattered charged particles end up at a position on the layer of cathodoluminescent material 19 adjacent to the position of the $0^{th}$ order transmitted charged particles, as indicated in FIG. 5. When these scattered charged particles hit the layer of cathodoluminescent material 19, photons are created from an interaction volume 191. When using the photons created by these scattered charged particles to make an image of the sample, a dark field image is obtained.

Figure 6:
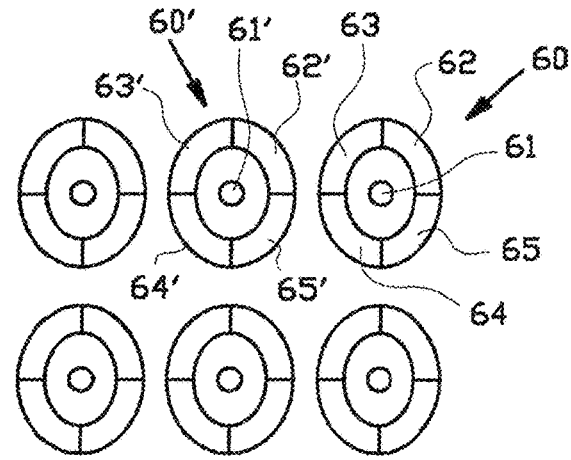
FIG. 6 shows an example of a segmentation of the detection area of a detector.

In order to distinguish between a $0^{th}$ order transmitted charged particles and the scattered charged particles, a segmentation of the detection area of a detector 20 can be used, as for example shown in FIG. 6.

In a first embodiment, the light sensitive area's of the detector 20 is arranged a shown in FIG. 6. Thus for each primary focussed charged particle beam there is a group 60, 60' of light sensitive area's, also denoted as pixels, comprising:

a centre light sensitive area 61, 61' for detecting light generated by the $0^{th}$ order transmitted charged particles, and a ring of light sensitive area's 62, 63, 64, 65, 62', 63', 64', 65' arranged around the centre light sensitive area 61, 61' for detecting light generated by the scattered charge particles.

In a second embodiment, the detector 20 comprises a large number of pixels arranged in rows and columns, which allow to detect any pattern of generated light to be detected.

From those pattern, the light generated from the individual primary focused charged particles 3, 3', 3" can be distinguished, because this light is arranged in a group of light spots. Each of such a group of light spots comprises a central part which originated from the interaction volume 190 of the $0^{th}$ order transmitted charged particles, see for example FIG. 5. This central part may be surrounded by light spots which originated from the interaction volume 191 of the scattered charged particles. The signals from these various light spots within the various groups can be separated using appropriated subroutines for reading out and analysing the light signals from the pixels of the detector 20.

Alternatively, specific pixels or groups of pixels may be allocated or assigned for example according to the pattern as shown in FIG. 6. The central pixel or group of pixels 61, 61' is assigned for detecting light generated by the $0^{th}$ order transmitted charged particles, and the surrounding pixels or group of pixels 62, 63, 64, 65, 62', 63', 64', 65' are assigned for detecting light generated by the scattered charge particles.

Figure 7A:
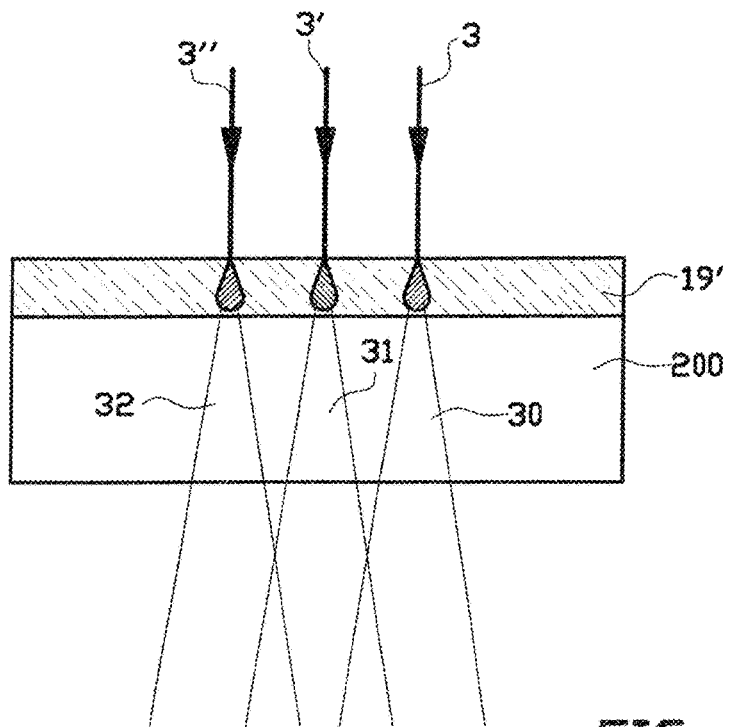
FIGS. 7A and 7B show an example of a thin cathodoluminescent layer on top of a light transmitting support plate.

In an exemplary embodiment the layer of cathodoluminescent material 19 comprises Yttrium aluminium garnet (YAG, Y3Al5O12), which is a synthetic crystalline material of the garnet group. Although a YAG crystal layer provides a very homogeneous and well defined layer of cathodoluminescent material, a disadvantageous of a layer of YAG is that it also absorbs part of the generated light. In order to limit the amount of absorption of the generated light, the layer of cathodoluminescent material 19' is preferably a thin layer, preferably smaller or equal to a maximum depth of the interaction volume, which is arranged on top of and/or supported by a light transmitting support plate 200, as for example shown in FIG. 7A.

Figure 7B:
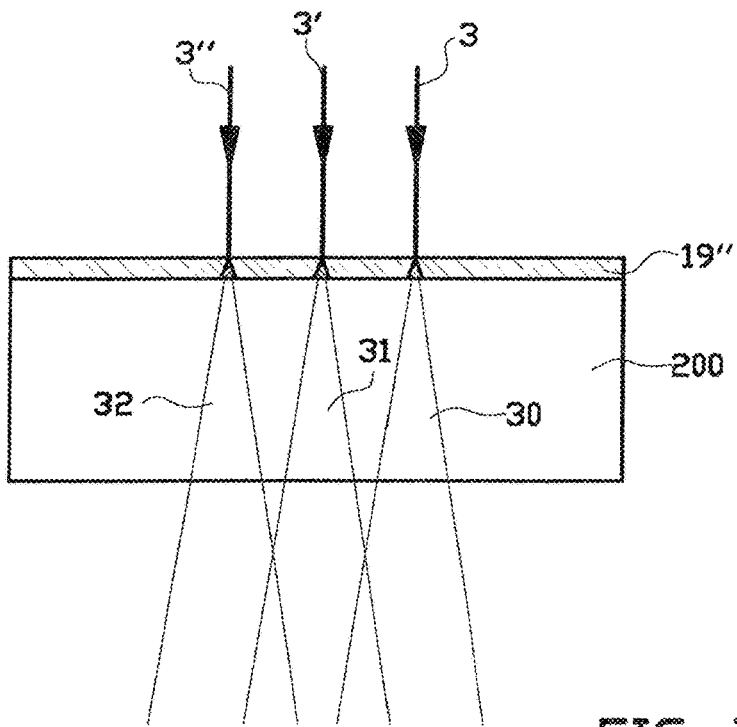

In an alternative exemplary embodiment, the layer of cathodoluminescent material 19" is thinner than the maximum depth of the interaction volume, which is also referred to as the scattering range, as shown in FIG. 7B. The use of such a thin layer of cathodoluminescent material 19" is, that signals from higher energy charged particle beams at least substantially do not interfere.

Figure 8:
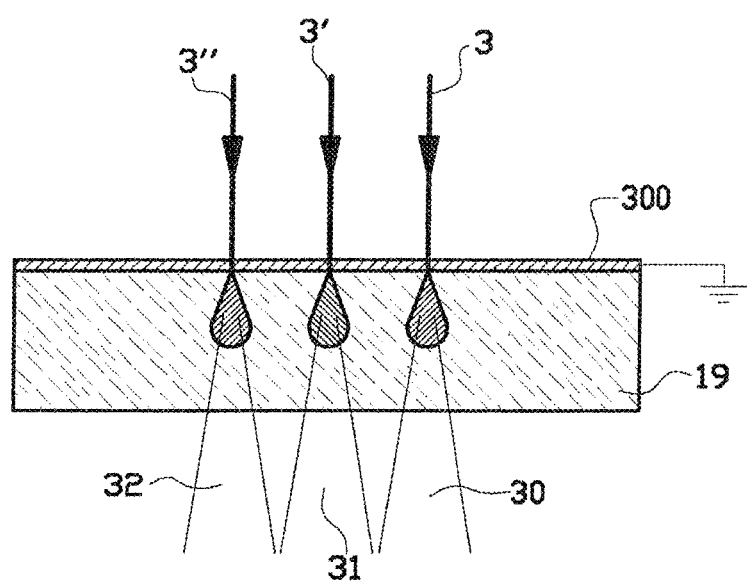
FIG. 8 shows an example of a cathodoluminescent layer provided with a charge conducting layer.

In addition or alternatively the layer of cathodoluminescent material 19 is covered with a charge conducting layer 300, as for example shown in FIG. 8. This charge conducting layer 300 is preferably arranged at a side of said layer of cathodoluminescent material 19 facing the electro-magnetic lens system 13, 14, and preferably is connected to ground potential. The charge conducting layer 300 comprises for example a layer of ITO and/or graphene. Alternatively or in addition, the charge conducting layer 300 comprises a thin metal layer, for example having a thickness of 10 to 20 nm. Such a thin metal layer provides the desired charge conducting properties and in addition provides a mirror effect for the photons created in the cathodoluminescent material 19, which mirror effect can increase the part of the created photons which are directed toward the optical arrangement 40 and the detector 20.

It is noted that the optical arrangement 40 comprises a lens system 41, 42 which is arranged for imaging said created photons 30, 31 onto the multi-pixel photon detector 20. Preferably the optical arrangement 40 provides an optical magnification between 5 and 500.

In order to obtain an image from the surface of the sample 15, the apparatus further comprising a system 18 for scanning the focused primary charge particle beams over said sample, and a control-and-signal-processing system 21 for controlling the scanning system 18 and the detector 20, and for analyzing the data from the detector 20 and creating one image per primary charged particle beam.

Alternatively or in addition, the apparatus further comprises a first actuating system 180 for moving the sample holder 150 at a constant speed in a first direction. Together with the scanning system 18 as a second actuating system, for scanning the focused primary charged particle beams over said sample in a second direction at least substantially perpendicular to the first direction, the focused primary charged particle beams can be scanned over an area of the surface of the sample 15. Again the control-and-signal-processing system 21 is for example arranged to create one image per primary charged particle beam.

The control-and-signal-processing unit 21 is preferably arranged and/or provided with appropriate subroutines for combining said individual images per primary charged particle beam into one combined image of at least a part of the sample 15.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. An apparatus for inspecting a sample, wherein the apparatus comprises:
    a sample holder for holding the sample,
    a multi beam charged particle generator for generating an array of primary charged particle beams,
    an electro-magnetic lens system for directing said array of primary charged particle beams into an array of separate focused primary charged particle beams at said sample holder,
    a multi-pixel photon detector arranged for detecting photons created by said focused primary charged particle beams when said primary charged particle beams impinge on the sample or after transmission of said primary charged particle beams through the sample, and
    an optical assembly for conveying photons created by at least two adjacent focused primary charged particle beams of said array of separate focused primary charged particle beams to distinct and/or separate pixels or to distinct and/or separate groups of pixels of the multi-pixel photon detector,
    wherein said apparatus comprises a layer of cathodoluminescent material, wherein the sample holder is arranged to position the sample between the electro-magnetic lens system and the layer of cathodoluminescent material, such that the charged particles impinge on the layer of cathodoluminescent material after transmission through said sample.

2. The apparatus according to claim 1, wherein the layer of cathodoluminescent material is supported by a light transmitting support plate.

3. The apparatus according to claim 1, wherein said layer of cathodoluminescent material is covered with a charge conducting layer.

4. The apparatus according to claim 3, wherein the charge conducting layer is arranged at a side of said layer of cathodoluminescent material facing the electro-magnetic lens system.

5. The apparatus according to claim 1, wherein said sample holder is arranged to position the sample in direct contact with and/or supported by said layer of cathodoluminescent material.

6. The apparatus according to claim 1, wherein said sample holder is arranged to position the sample at a distance from said layer of cathodoluminescent material.

7. The apparatus according to claim 1, wherein said optical arrangement comprises a lens system which is arranged for imaging said created photons onto the multi-pixel photon detector with an optical magnification between 5 and 500.

8. The apparatus according to claim 1, wherein the electro-magnetic lens system is arranged to project an array of separate spots on the sample surface where the focused primary charged particle beams impinge on the sample on the sample holder, wherein the pitch between the spots on the sample surface is between 0.3 and 30 micrometers.

9. The apparatus according to claim 1, wherein the multi-pixel photon detector is a CCD camera, a CMOS camera, an array of avalanche photo diodes or an array of photo multipliers.

10. The apparatus according to claim 9, wherein the CCD camera, CMOS camera, array of avalanche photo diodes or photo multipliers comprises an array of detector pixels is positioned such that the array of detector pixels coincides with an array of images of the individual light spots created by the individual beams of said primary charged particle beams.

11. The apparatus according to claim 1, further comprising a system for scanning the focused primary charge particle beams over said sample holder, and a control-and-signal-processing system for creating one image per primary charged particle beam.

12. The apparatus according to claim 11, wherein said apparatus further comprises a signal processing unit for combining said individual images per primary charged particle beam into one combined image of at least a part of the sample.

13. The apparatus according to claim 1, further comprising a first actuating system for moving the sample holder at a constant speed in a first direction, and a second actuating system for scanning the focused primary charge particle beams over said sample holder in a second direction at least substantially perpendicular to the first direction, and a control-and-signal-processing system for creating one image per primary charged particle beam.

14. The apparatus according to claim 13, wherein said apparatus further comprises a signal processing unit for combining said individual images per primary charged particle beam into one combined image of at least a part of the sample.

15. A method for inspecting a sample, said method comprising the steps of:
providing an apparatus which comprises:
a sample holder which holds the sample,
a multi beam charged particle generator which generates an array of primary charged particle beams,
an electro-magnetic lens system which directs said array of primary charged particle beams into an array of separate focused primary charged particle beams on said sample in or on the sample holder,
a multi-pixel photon detector arranged to detect photons created by said focused primary charged particle beams when said primary charged particle beams impinge on the sample or after transmission of said primary charged particle beams through the sample, and
an optical assembly which conveys the photons created by at least two adjacent focused primary charged particle beams of said array of separate focused primary charged particle beams to distinct and/or separate pixels or to distinct and/or separate groups of pixels of the multi-pixel photon detector,
wherein said apparatus comprises a layer of cathodoluminescent material, wherein the sample holder is arranged to position the sample between the electro-magnetic lens system and the layer of cathodoluminescent material, wherein the charged particles which pass through said sample subsequently impinge on the layer of cathodoluminescent material,
the method comprising the steps of:
positioning the sample between the electro-magnetic lens system and the layer of cathodoluminescent material,
generating an array of primary charged particle beams,
directing said array of primary charged particle beams into an array of separate focused primary charged particle beams on said sample, and
detecting photons created by said focused primary charged particle beams when said primary charged particle beams impinge on the sample or after transmission of said primary charged particle beams through the sample.

\* \* \* \* \*